United States Patent [19]

Embree

[11] Patent Number: 5,684,432
[45] Date of Patent: Nov. 4, 1997

[54] AMPLIFIER OUTPUT STAGE HAVING ENHANCED DRIVE CAPABILITY

[75] Inventor: Milton Luther Embree, Muhlenberg Township, Berks County, Pa.

[73] Assignee: Lucent Technologies Inc., Murray Hill, N.J.

[21] Appl. No.: 578,819

[22] Filed: Dec. 26, 1995

[51] Int. Cl.[6] ........................................... H03F 3/30
[52] U.S. Cl. ..................... 330/255; 330/269; 330/273; 330/275
[58] Field of Search .................................. 330/255, 262, 330/265, 269, 271, 273, 274, 275

[56] References Cited

U.S. PATENT DOCUMENTS

| | | | |
|---|---|---|---|
| 4,405,902 | 9/1983 | van de Plassche et al. | 330/271 |
| 4,542,348 | 9/1985 | Lucas et al. | 330/253 |
| 4,587,491 | 5/1986 | Koterasawa | 330/268 |
| 4,803,442 | 2/1989 | Hogg | 330/274 |
| 4,922,208 | 5/1990 | Susak et al. | 330/255 |

Primary Examiner—James B. Mullins
Attorney, Agent, or Firm—John M. Harman

[57] ABSTRACT

The invention is an operational amplifier having an output stage for enhancing the output driver capability near the negative source voltage. The output stage of the invention includes a voltage detector in combination with a current redirector or redirecting arrangement. The voltage detector converts the voltage difference between the amplifier output and the input to the output stage of the amplifier to a control current, which is redirected at the positive source voltage and applied to the negative output driver. The current redirector, which is operably connected to the voltage detector, allows the amplifier output to be driven at full rated current (e.g., approximately 40 mA) close to the negative source voltage (e.g., within approximately 1.5 volts) while maintaining an output configuration appropriate for stability.

17 Claims, 5 Drawing Sheets

AMPLIFIER OUTPUT STAGE HAVING ENHANCED DRIVE CAPABILITY

BACKGROUND OF THE INVENTION

1. Field of the Invention

The invention relates to amplifier circuitry. More particularly, the invention relates to the design of an output stage for amplifiers including high voltage operational amplifiers.

2. Description of the Related Art

It is known to use high voltage N-channel double diffused metal oxide-semiconductor (DMOS) transistors or lateral, double diffused metal-oxide semiconductor (LDMOS) transistors as output drivers in the output stages of high voltage monolithic operational amplifiers and other high voltage amplifiers. Furthermore, it is known to arrange these transistors in a source output configuration for stability considerations as dictated by certain amplifier applications. A source output configuration is formed by combining a MOS P-channel output drive transistor and a MOS N-channel output drive transistor such that the source terminal of each device is connected to the output terminal of the amplifier.

The source output configuration is highly advantageous in applications where complex load impedances must be driven. The source output configuration has an inherently low output impedance that is mostly resistive. This increases the frequency where significant phase shift occurs as a result of complex loads, such as telephone line circuits to above the unity gain frequency of an operational amplifier, thereby maintaining stability. Additionally, characteristics of the output stage for such applications include a high frequency response and the ability to adequately supply load current.

For example, when used in battery feed circuitry for telephone lines, the source output configuration is necessary to assure adequate stability margins under all conditions of operation. However, the ability to drive the output at full rated current close to the negative source voltage of the operational amplifier is also very important. A typical telephone line circuit requirement is the ability to drive up to approximately 40 mA into the telephone line down to within approximately 1.5 volts of the negative source voltage.

Figure 1:
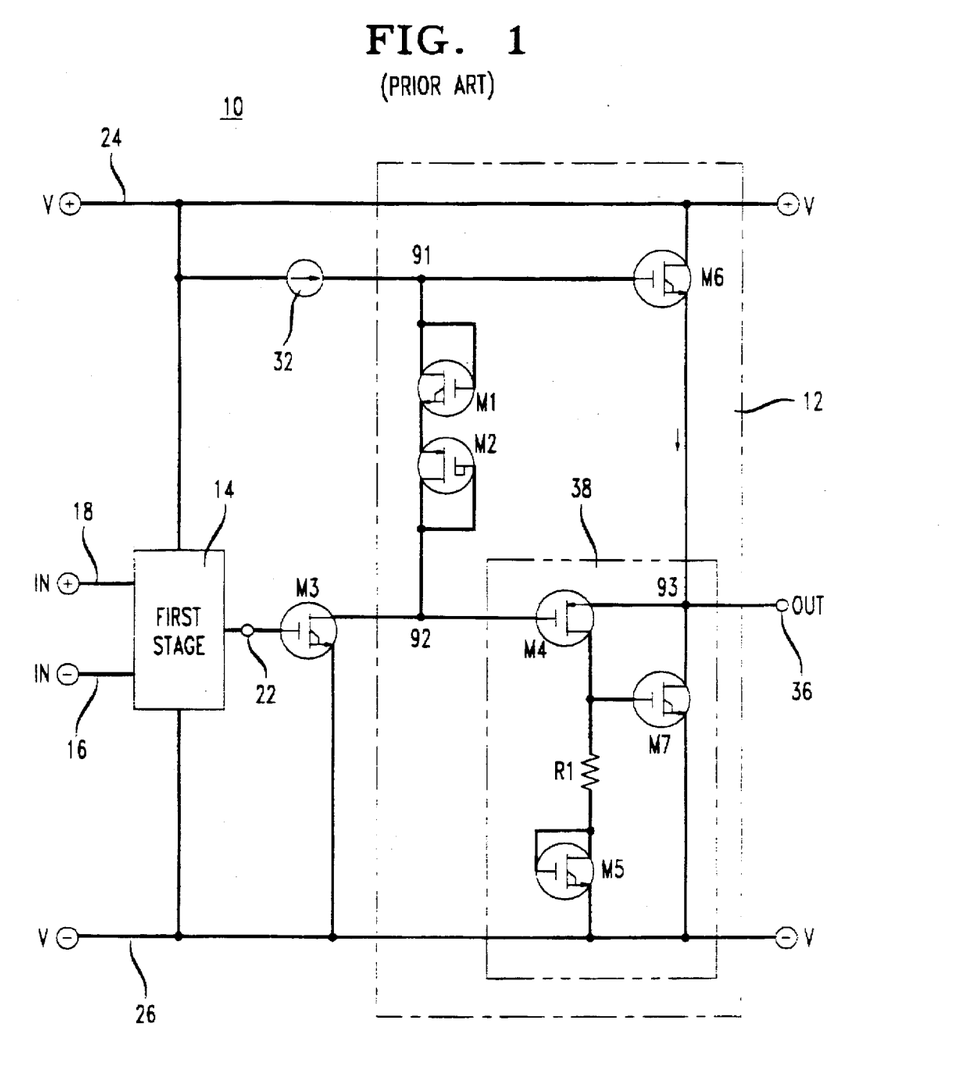
FIG. 1 is a schematic diagram of an operational amplifier output stage that does not meet the desired voltage drive criteria.

FIG. 1 shows a schematic diagram of a conventional operational amplifier output stage. In all of the Figs. described herein, DMOS transistors and insulated-gate field-effect transistors (IGFETs) are referenced by the letter M and resistors are referenced by the letter R.

Also, for all IGFETs shown and described herein that have the same channel length, a multiplicative factor of their respective channel width (in microns) is given for comparative purposes and in aiding appropriate selection of similar devices. For example, the P-channel IGFET M2 (×100) has a channel width factor of 100, making its performance characteristics equivalent to 100 P-channel IGFET M4 (×1) transistors in parallel, assuming both have the same channel length. This arrangement also exists for all the DMOS transistors shown and described herein. In general, devices with larger channel widths are physically larger, but such relationship is not necessarily proportional.

In conventional high voltage operational amplifiers, the output stage is typically a quasi-complementary configuration with a positive drive transistor using either a bipolar NPN or MOS N-channel transistor, and a negative drive configuration using a composite arrangement having either a bipolar PNP or MOS P-channel transistor. A complementary output configuration becomes a quasi-complementary configuration when at least one of the output drive transistors is replaced by a composite circuit that collectively behaves like a single output drive transistor of interest. Typically, due to performance and ease of manufacturing considerations, the PNP or MOS P-channel drive transistor is replaced with a composite circuit.

Referring to FIG. 1, there is shown a conventional operational amplifier 10 having a quasi-complementary output stage 12. Operational amplifier 10 has a first stage (shown generally as 14) with an inverting input terminal 16, a noninverting terminal 18 and an output terminal 22. Also, first stage 14 is connected to a positive source voltage or rail 24 and a negative source voltage rail 26. For purposes of discussion in this description, first stage 14 represents generally all stages of a conventional operational amplifier not shown in FIG. 1. That is, first stage 14 represents the input stage, the bias stage and the like of a conventional operational amplifier.

A constant current source 32 is connected between positive source voltage 24 and a node 91. An N-channel DMOS transistor M3 connects as shown between negative source voltage 26, output terminal 22 from first stage 14 and a node 92. Both current source 32 and DMOS transistor M3 are thought of conventionally as part of a second stage that exists between the input and output stages of operational amplifiers and thus, for purposes of discussion herein, are not considered part of either first stage 14 or output stage 12.

In output stage 12 of operational amplifier 10, quiescent current control transistors such as diode connected P-channel IGFET M2 (×100) and diode connected N-channel DMOS transistor M1 (×100) are diode connected in series between nodes 91 and 92, as shown. For example, the gate and drain of DMOS transistor M1 is connected to node 91 and the source is connected to the source of P-channel IGFET M2. The gate and drain of P-channel IGFET M2 is connected to node 92 and thus is connected to the drain of DMOS transistor M3, which is conventionally referred to as the second stage amplifier transistor.

Also connected to node 92 is the gate of a high voltage, P-channel IGFET M4 (×1), whose source connects directly to an output terminal 36 of operational amplifier 10 via a node 93. The drain of M4 connects to one end of a resistor R1 (typically 10 kΩ) and the gate of an N-channel DMOS transistor M7, which will be discussed below. The other end of resistor R1 connects to the drain and gate of a diode connected N-channel DMOS transistor M5 (×5). The source of DMOS transistor M5 connects to the negative source voltage 26.

Connected to positive source voltage 24 is the drain of an N-channel DMOS transistor M6 (×100). The gate of DMOS transistor M6 connects to node 91, which, as mentioned previously, is connected to constant current source 32 and the gate and drain of diode connected DMOS transistor M1. The source of DMOS transistor M6 connects directly with output terminal 36 via node 93.

The final component typically found in operational amplifier 10 is an N-channel DMOS transistor M7 (×100), whose drain connects to output terminal 36 via node 93. The gate of M7, as mentioned previously, connects to the drain of M4 along with one end of resistor R1 as shown. The source of M7 connects directly to negative source voltage 26.

In this configuration, M4, M5, R1 and M7 collectively form a composite drive circuit (shown as 38) that functions as a P-channel DMOS with its source connected directly to output terminal 36, its drain connected directly to the negative source voltage 26, and its gate connected to node 92. In this manner, composite circuit 38 combines with DMOS transistor M6 to satisfy the source output configuration requirement for stability, as discussed previously.

In general, DMOS transistor M1, IGFET M2 and the gates of IGFET M4 and DMOS transistor M6 collectively constitute the input or control side of output stage 12 of operational amplifier 10. Similarly, the drain and source of DMOS transistor M6, the drain and source of IGFET M4, and the rest of composite drive circuit 38 collectively constitute the output side of output stage 12.

In operation, when the voltage at node 92 is forced toward the negative source voltage 26 (e.g., in response to voltage increases at 16 and for voltage decreases at 18), the source-to-drain current of M4 increases and causes an increase in the gate-to-source voltage of M7. This increases the drain-to-source current of M7 thereby moving the value of the output voltage of operational amplifier 10 negatively toward the negative source voltage 26. As the output voltage (i.e., the voltage at node 93) moves negatively and the gate voltage of M7 moves positively, the source-to-drain voltage of M4 decreases toward zero.

When this voltage reaches the "triode" region of operation of IGFBT M4, i.e., the region of operation in which a further decrease in voltage at node 92 no longer causes an increase in the drain current of M4, the limiting negative drive condition of the operational amplifier has been reached. Typically, the "triode" region voltage is approximately 0.5 volts between the drain and source of M4, which yields an output voltage minimum (at output terminal 36) for this circuit arrangement of approximately 3.5 volts from negative source voltage 26. Therefore, this circuit arrangement is not capable of driving outputs in, e.g., telephone line circuits, which must be driven within approximately 1.5 volts from negative source voltage 26.

Present telephone line battery feed circuits use complementary bipolar integrated circuit (CBIC) technology in which the operational amplifiers therein use power PNP transistors for the negative drive portion of the output driver. However, such configuration is not monolithically compatible with the present high voltage MOS switches and logic circuitry. Furthermore, the MOS technologies in use today, especially high voltage MOS technology, do not support high performance PNP transistors.

It would be desirable to have available a high voltage amplifier output stage circuitry configuration that will meet the drive requirements as mentioned above yet still retain the source output configuration or other appropriate configuration that is needed for stability.

SUMMARY OF THE INVENTION

According to its major aspects and broadly stated, the invention is an amplifier with an improved output stage. In particular, it is an amplifier having an output stage with enhanced output driver capability near the negative source voltage. The output stage of the invention includes a voltage detector in combination with a current redirector or redirecting arrangement. The voltage detector converts the voltage difference between the amplifier output and the input to the output stage of the amplifier to a control current, which is redirected at the positive source voltage and applied to the negative output driver. The current redirector, which is operably connected to the voltage detector, allows the amplifier output to be driven at full rated current (e.g., approximately 40 mA) very close to the negative source voltage (e.g., within approximately 1.5 volts) while maintaining an output configuration appropriate for stability.

DETAILED DESCRIPTION

The inventive portion of the circuit, which will be discussed in greater detail below, overcomes various problems of conventional operational amplifiers generally by turning or redirecting current from the control side of the output stage around at the positive source voltage and applying it to the negative drive composite circuit. Specifically, a current redirector or current redirecting arrangement is connected generally between the control side and the output side of the output stage so that redirected current is supplied to the negative output driver.

For purposes of discussion in this description, the term "current redirector" is understood to be any suitable device or arrangement of devices that enhances the drive capability of the negative output driver by generally redirecting current thereto so that, e.g., it can drive up to approximately 40 mA within approximately 1.5 volts of the negative source voltage. Similarly, for purposes of discussion in this description, the term "voltage detector" or "voltage difference detector" is understood to be any suitable device or arrangement of devices that converts the difference between two voltages to a control current. As will be discussed below, it is this control current from the voltage detector that causes current to be redirected by the current redirector.

Figure 2:
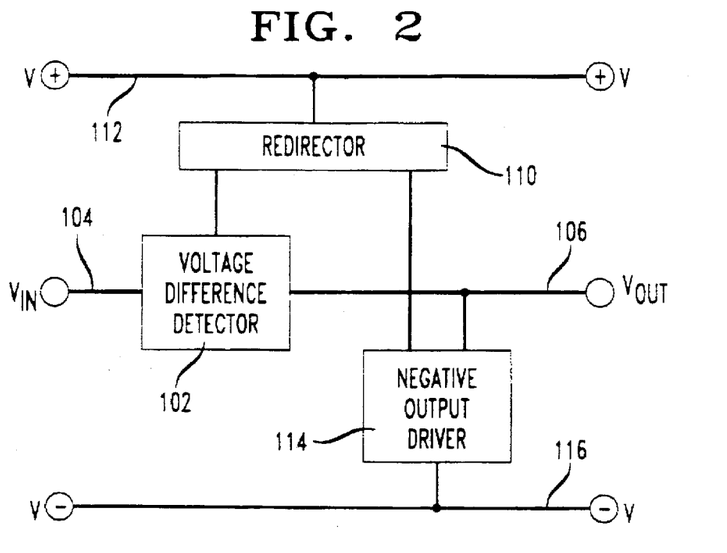
FIG. 2 is a schematic diagram of an amplifier output stage according to an embodiment of the invention.

For example, in FIG. 2, an embodiment of the invention is shown that can be operably coupled to the output of an existing signal source, including an operational amplifier. In this embodiment, a voltage detector 102 is in operable connection between an input terminal 104, which is operably connected to the output of an existing amplifier or other signal source (not shown), and the arrangement's output terminal 106. A current redirector 110 is operably connected to a positive source voltage 112 and voltage detector 102. Also, current redirector 110 is operably connected to a negative output driver 114, which is connected between the output terminal 106 and a negative source voltage 116.

Current redirector 110 includes any suitable current redirecting arrangement, such as a current mirror arrangement. Similarly, negative output driver 114 is any arrangement that functions as a negative output driver, e.g., the negative driver shown in FIG. 1 and described herein previously. Similarly, voltage detector 102 includes any known device or arrangement of devices that converts the difference between two voltages to a control current.

The inventive voltage detector and current redirector arrangement is suitable for use with any signal source such as amplifier circuits and including operational amplifier circuits. Also, the inventive arrangement is suitable for operable connection to existing amplifiers (i.e., the arrangement does not have to be contained within a circuit package).

Figure 3:
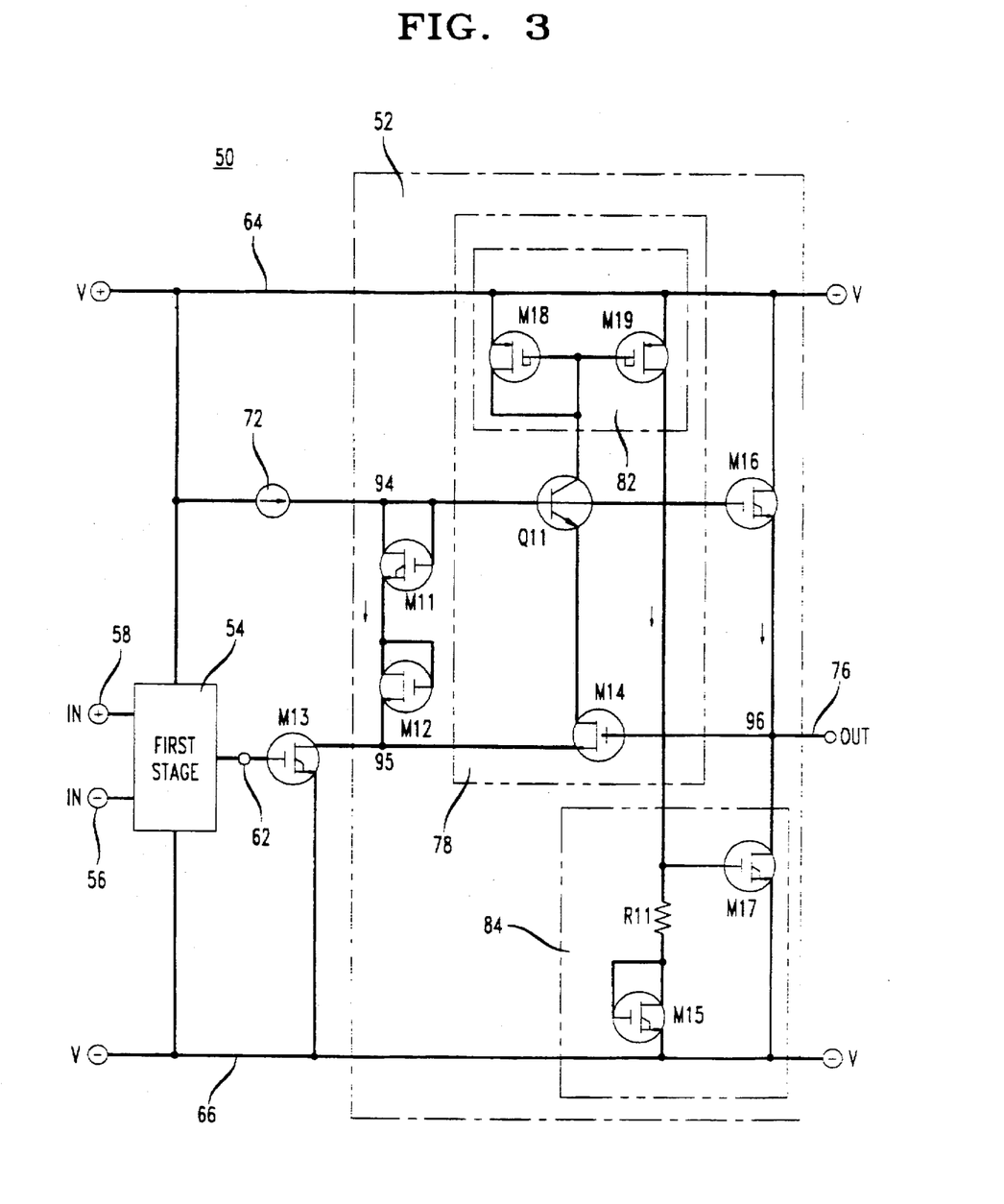
FIG. 3 is a schematic diagram of an operational amplifier output stage according to an embodiment of the invention.

Referring to FIG. 3, there is shown an operational amplifier 50 having a quasi-complementary output stage (shown generally as 52) according to an embodiment of the invention. Operational amplifier 50 has a first stage (shown generally as 54) with an inverting input terminal 56, a noninverting terminal 58 and an output terminal 62. Also, first stage 54 is connected to a positive source voltage or rail 64 and a negative source voltage or rail 66. For purposes of discussion in this description, first stage 54 represents generally all stages of a conventional operational amplifier not shown in FIG. 3, e.g., the input stage and the bias stage. Furthermore, it will be understood that, except for the novel output stage 52 of operational amplifier 50, operational amplifiers according to the invention can have conventional structure.

A constant current source 72 is connected between positive source voltage 64 and a node 94. An N-channel DMOS transistor M13 connects between negative source voltage 66, output terminal 62 of first stage 54 and a node 95. Both current source 72 and DMOS transistor M13 are typically thought of as part of a second stage that exists between the input and output stages of operational amplifiers and thus, for purposes of discussion herein, are not considered to be part of output stage 52 or first stage 54.

In output stage 52 of operational amplifier 50, quiescent current control transistors, such as diode connected N-channel DMOS transistor M11 (×100) and diode connected N-channel IGFET M12 (×100), are connected in series between nodes 94 and 95. The gate and drain of DMOS transistor M11 is in connection with node 94 (and thus is connected to current source 72) and the source of DMOS transistor M11 is connected to the gate and drain of IGFET M12. The source of IGFET M12 is in connection with node 95, and is connected to the source of a low voltage, N-channel IGFET M14 (×1) and the drain of second stage amplifier transistor M13.

In general, DMOS transistor M11, IGFET M12, the gate of DMOS transistor M16 and the source of IGFET M14 collectively constitute the input or control side of output stage 52. The output side of output stage 52 is formed by a positive output driver (N-channel DMOS transistor M16) and a negative output driver (shown generally as 84). The drain of positive drive transistor DMOS transistor M16 (×100) is connected directly to positive source voltage 64 and the source is connected directly to an output terminal 76 of operational amplifier 50 via a node 96.

Negative output driver 84 is an amplifying current mirror composite circuit formed by an N-channel DMOS transistor M15 (×2), a resistor R11 (typically 10 kΩ) and an N-channel DMOS transistor M17 (×100). The drain of an P-channel IGFET M19 (×1), which will be discussed later, connects to composite circuit 84 via one end of a resistor R11 and to the gate of DMOS transistor M17. The other end of resistor R11 connects to the drain and gate of diode connected N-channel DMOS transistor M15. The source of DMOS transistor M15 connects to negative source voltage 66. The drain of DMOS transistor M17 connects directly to the source of positive drive transistor DMOS transistor M16 and to output terminal 76 via node 96. The source of DMOS transistor M17 connects directly to negative source voltage 66.

One embodiment of the inventive arrangement is shown generally as 78. A current redirecting configuration, e.g., the arrangement shown generally as 82, is connected between the control side and the output side of output stage 52. A common-base NPN voltage buffering transistor Q11 connects current redirector 82 with IGFET M14, which acts as a voltage difference detector. The source of IGFET M14 connects to node 95 and the gate connects directly to output terminal 76 via node 96. Because of its position in the circuit and its relationship with DMOSs M15 and M17, the voltage difference detector contributes directly to the maintenance of the source output configuration, which, as discussed previously, is needed for stability during operation of the circuit.

The drain of IGFET M14 connects to the emitter of buffering transistor Q11. The base of common-base NPN transistor Q11 connects to the gate and drain of diode connected N-channel DMOS transistor M11 and to the gate of an N-channel DMOS transistor M16.

Current redirector 82 can be any suitable arrangement, such as the high voltage, P-channel current mirror configuration shown here. P-channel IGFETs M18 (×1) and M19 (×1) are connected to positive source voltage 66 via their sources. The gate of IGFET M19 is connected to the gate and drain of diode connected IGFET M18, and to the collector of NPN transistor Q11.

Low voltage N-channel IGFET M14 (×1), which is not considered to be a part of negative output driver 84, acts as a voltage difference detector between the output voltage (node 96) and the input voltage of output stage 52 (node 95). For all gate-to-source voltages of N-channel IGFET M14 below the threshold voltage (typically approximately 1.0 volts), the drain-to-source current is 0 mA. As the gate-to-source voltage of IGFET M14 increases positively, its drain-to-source current increases rapidly according to its design characteristics.

Common base connected high voltage NPN transistor Q11 acts as a voltage buffer for low voltage N-channel IGFET M14. Its collector current is effectively equal to its emitter current. Also, the drain-to-source voltage of M14 is limited to less than the drop across diode connected transistors M11 and M12, and the high voltage capability of Q11 assures proper circuit operation at high voltage.

In this arrangement, it should be noted that transistors M12 and M14 should be of the same transistor type and structure for proper quiescent current control of operational amplifier 50. Control of quiescent current is an indirect yet essential consideration in all operational amplifier circuits and is a well known consideration to those skilled in the art. In general, quiescent current is known as the total operational amplifier current under quiescent conditions, i.e., under no load conditions. Here, M12 is a ×100 IGFET and M14 is a ×1 IGFET. Also, M11 and M16 should be characteristically matched, i.e., the same transistor type, structure and size (channel width). In this embodiment, both M11 and M16 are ×100 N-channel DMOSs.

In this arrangement, quiescent current control depends on the size ratio of M12 and M14 being approximately equal to the ratio of their currents under quiescent conditions. Also, this ratio must be approximately equal to the input-to-output current ratio of composite circuit 84 under quiescent conditions.

In operation, a redirecting arrangement, such as the one shown generally as 82, redirects or turns the control current from the voltage difference detector, e.g., M14, around at the positive source voltage 64 and applies it to the negative driver (composite circuit 84). Computer simulations have shown that, as the voltage at node 95 decreases, the output voltage at node 96 lowers to approximately 1.2 volts before the limiting negative condition is reached. Also, as the voltage at node 95 is driven lower, M17 enters its "triode" region of operation in which the drain-to-source voltage responds linearly to the drain current and is independent of changes in its gate voltage (i.e., the drain-to-source characteristic is that of a resistor).

The current redirector arrangement as described herein causes little if any restriction in the positive drive voltage at the gate of M17. Thus, the negative drive capability of output stage 52 is limited only by the inherent R-on characteristics of DMOS transistor M17. R-on operating characteristics are known in the art and occur when the transistor enters its "triode" region of operation, as discussed previously. By choosing M17 based on its inherent R-on characteristics (e.g., an R-on of approximately 17.5 ohms), one skilled in the art can reasonably determine a suitable size for M17 to provide the required negative drive current (e.g., 40 mA) at less than the required voltage (e.g., 1.5 volts) from the negative source voltage.

Also, because the negative drive at the output is controlled from what functions as the gate-to-source voltage of a MOS transistor (e.g., M14) the crucial source output configuration required for stability is retained.

Figure 4:
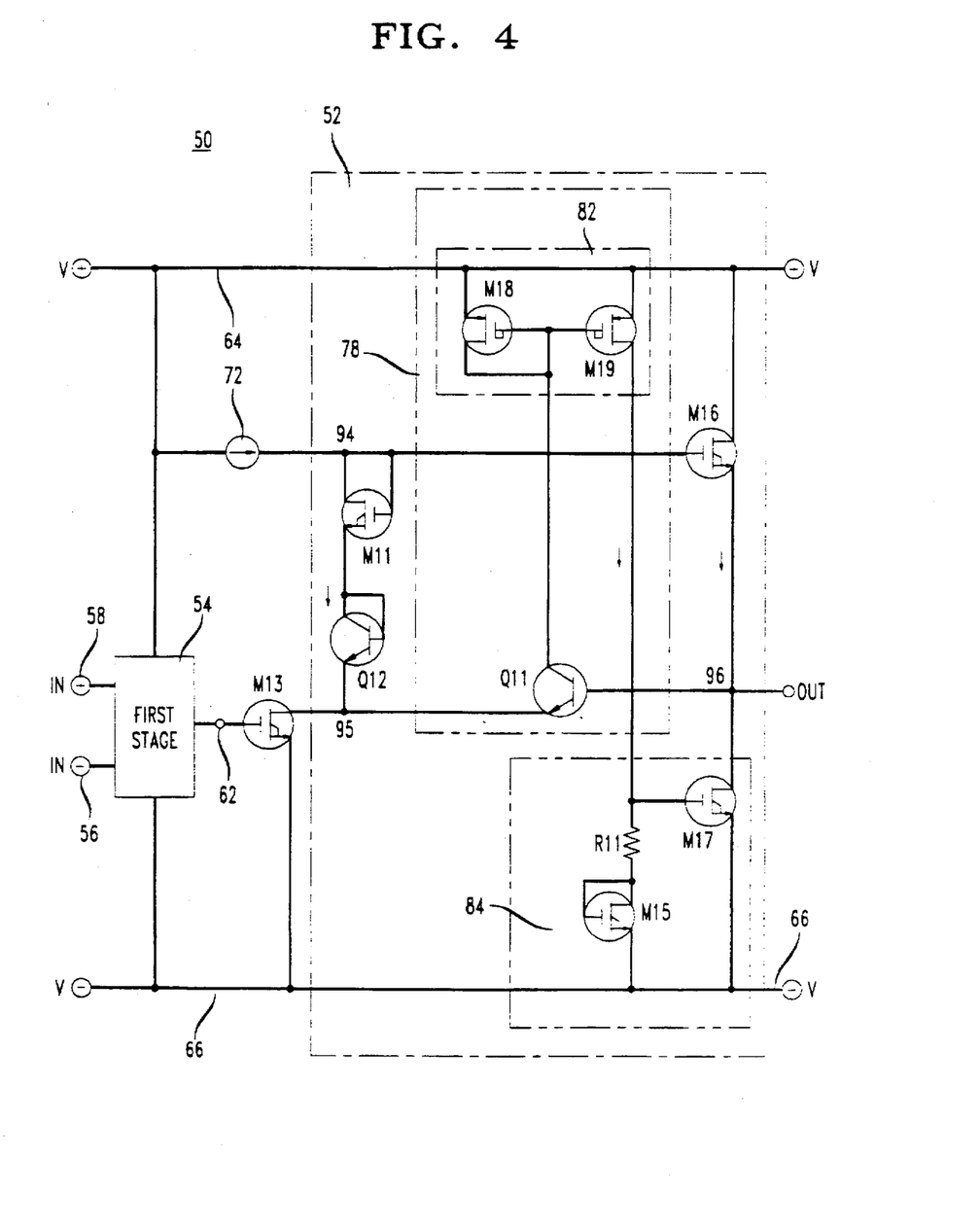
FIG. 4 is a schematic diagram of an operational amplifier output stage according to another embodiment of the invention.

In an alternative embodiment as shown in FIG. 4, a high voltage NPN transistor Q11 (×1) acts as the voltage difference detector and a diode connected high voltage NPN transistor Q12 (×100) assures correct quiescent current control. Operation is similar in all respects to the embodiment as shown in FIG. 3, except that no high voltage buffer transistor is required.

Figure 5A:
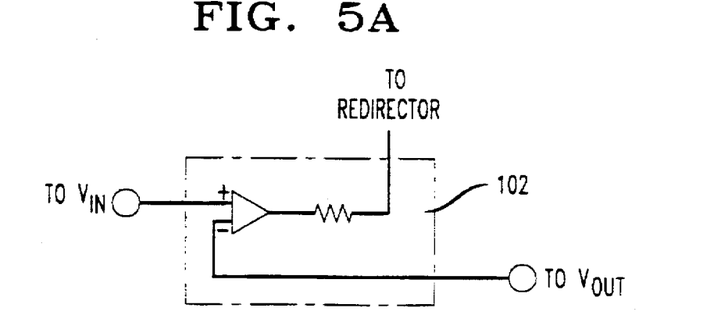
FIG. 5a is a partial schematic diagram of a voltage detector used in the amplifier output stage of FIG. 2.
Figure 5B:
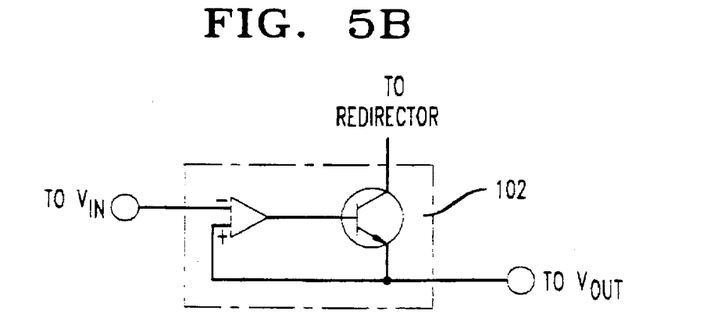
FIG. 5b is a partial schematic diagram of another voltage detector used in the amplifier output stage of FIG. 2.

As previously discussed, voltage detector 102 (shown in FIG. 2) includes any known device or arrangement of devices that converts the difference between two voltages to a control current. For example, in addition to a single N-channel MOS transistor (M14 in FIG. 3) and a single NPN bipolar transistor (Q11 in FIG. 4), suitable voltage detectors include the combination of an operational amplifier and resistor connected as shown in FIG. 5a, and the combination of an operational amplifier and an NPN bipolar transistor connected as shown in FIG. 5b.

Figure 6:
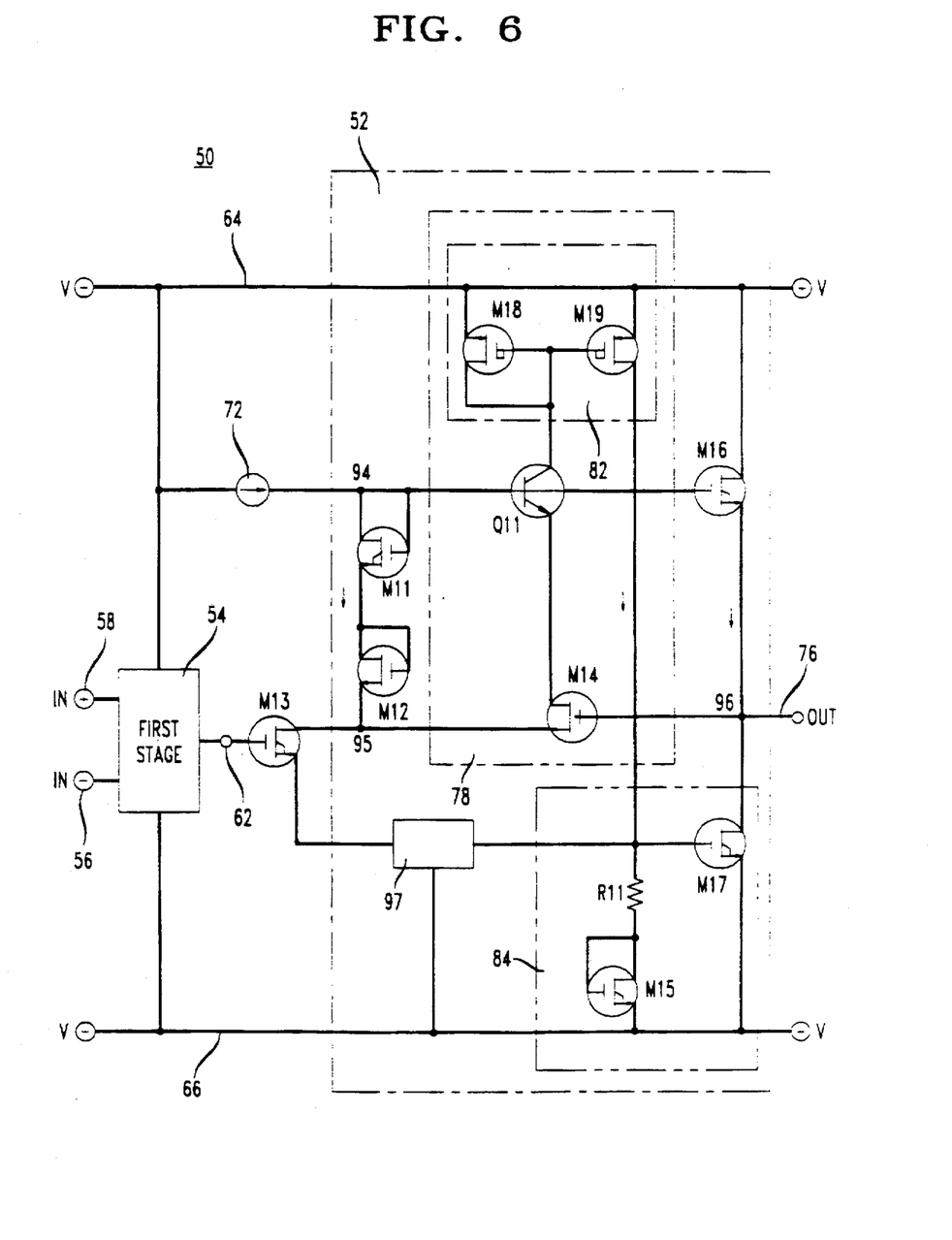
FIG. 6 is a schematic diagram of an operational amplifier output stage according to an alternative embodiment having a feedforward arrangement.

In FIG. 6, an alternative embodiment of the invention is shown in which a feedforward arrangement (shown generally as 97) is included to improve the overall frequency response of the circuit by providing a wide bandwidth path to feed a portion of the signal forward around the relatively low frequency circuitry, i.e., voltage detector M14 and current redirector 82. Feedforward arrangements are known process control arrangements in which changes are detected near the process input and an anticipating correction signal is applied before the process output signal is affected. It is to be understood that many feedforward arrangements are suitable for use in this embodiment and that such arrangements are known by those skilled in the art.

It will be apparent to those skilled in the art that changes and substitutions can be made to the operational amplifier output circuitry herein described without departing from the spirit and scope of the invention as defined by the appended claims.

What is claimed is:

1. An integrated circuit having an amplifier output stage for use with a signal source, said amplifier output stage comprising:

a voltage detector having a first input terminal, a second input terminal and an output terminal, said first input terminal for receiving a signal source;

a redirector for connecting to a positive source voltage, said redirector having a first connection to said voltage detector output terminal and a second connection; and a negative output driver connected to said redirector and for connecting to a negative source voltage, said negative output driver connected to said second input terminal of said voltage detector to form the output of said amplifier output stage, wherein said redirector includes a first transistor and a second transistor connected together in a current mirror arrangement between said voltage detector, said positive source voltage and said negative output driver, and wherein said redirector provides to said negative output driver an output current that is in phase with the input current to said redirector.

2. The circuit as recited in claim 1, wherein said voltage detector further comprises an NPN bipolar transistor whereby the emitter is said first input terminal, the base is said second input terminal and the collector is said voltage detector output terminal.

3. The circuit as recited in claim 1, wherein said voltage detector further comprises an operational amplifier having an inverting terminal, a noninverting terminal and an output terminal, wherein said noninverting terminal is said first voltage detector input terminal, wherein said inverting terminal is said second voltage detector input terminal, and wherein said operational amplifier output terminal is operably connected to said first connection of said redirector.

4. The circuit as recited in claim 1, wherein said voltage detector further comprises:

an operational amplifier having an inverting terminal, a noninverting terminal and an output terminal, wherein said inverting terminal is said first voltage detector input terminal; and an NPN bipolar transistor whereby the collector is said voltage detector output terminal, said base is connected to said operational amplifier output terminal, and the emitter and said operational amplifier noninverting terminal are operably connected to said amplifier output stage output thereby forming said second voltage detector input terminal.

5. The circuit as recited in claim 1, wherein said amplifier output stage further comprises a feedforward arrangement operably connected between said signal source output and said negative output driver.

6. An integrated circuit having an amplifier, said amplifier comprising:

a first stage having a noninverting input terminal, an inverting input terminal and an output terminal, said first stage in electrical connection with a positive source voltage and a negative source voltage; and an output stage having a control side operably connected to said output terminal of said first stage and an output side with an output terminal, said output side having a negative output driver operably connected between said output stage output terminal and said negative source voltage;

a redirector operably connected between said control side and said output side, said redirector including a first transistor and a second transistor connected together in a current mirror arrangement; and a voltage detector operably connected to said redirector and between said control side and said output side, said voltage detector generating a control current, based on the voltage at the output of said amplifier less the voltage at the input of said amplifier output stage, that causes said redirector to provide to said negative output driver an output current that is in phase with the input current to said redirector.

7. The circuit as recited in claim 6, wherein said voltage detector further comprises a MOS transistor voltage detector operably connected to said redirector and between said first stage output terminal and said output stage output terminal, wherein the source of said voltage detector is operably connected to said first stage output terminal, wherein the drain of said voltage detector is operably connected to said redirector, and wherein the gate of said voltage detector is operably connected to said output stage output terminal.

8. The circuit as recited in claim 6, wherein said voltage detector further comprises an operational amplifier operably connected to said redirector and between said first stage output terminal and said output stage output terminal, said operational amplifier having a noninverting input operably connected to said first stage output terminal, an inverting input operably connected to said output stage output terminal, and an output operably connected to said redirector.

9. The circuit as recited in claim 6, wherein said amplifier further comprises a feedforward arrangement operably connected between said first stage output terminal and said negative output driver.

10. The circuit as recited in claim 6, wherein said amplifier further comprises a voltage buffer operably connected between said redirector and said voltage detector.

11. The circuit as recited in claim 6, wherein said output stage control side further comprises a pair of N-channel, diode connected MOS control transistors connected in series between a current source connected to said positive source voltage and a second stage amplifier transistor connected to said negative source voltage.

12. An integrated circuit having an amplifier, said amplifier comprising:
   a first stage having a noninverting input terminal, an inverting input terminal and an output terminal, said first stage capable of electrical connection with a positive source voltage and a negative source voltage; and
   an output stage having
      a control side capable of connection to said output terminal of said first stage, said control side having a first transistor and a second transistor diode connected in series between a current source for connecting to said positive source voltage and a second stage amplifier transistor connected to said output terminal of said first stage and for connecting to said negative source voltage,
      an output side with an output terminal, said output side having a negative output driver connected between said output stage output terminal and said negative source voltage,
      a redirector that alters current flow to said negative output driver, said redirector connected to said positive source voltage and operably connected between said control side and said output side, and
      a voltage detector operably connected to said redirector and operably connected between said control side and said output side output terminal, wherein said voltage detector comprises a transistor, wherein a positive output driver comprises an output transistor, wherein said second control side transistor and said voltage detector transistor are the same transistor type, and wherein said first control side transistor and said positive output driver transistor are characteristically matched.

13. The circuit as recited in claim 12, wherein said redirector includes a current mirror arrangement operably connected between said control side and said negative output driver.

14. The circuit as recited in claim 13, wherein said current mirror arrangement further comprises:
   a first diode connected P-channel IGFET whose source is connected to said positive source voltage and whose gate and drain are operably connected to said control side; and
   a second P-channel IGFET whose source is connected to said positive source voltage, whose gate is connected to the gate of said first diode connected P-channel IGFET and operably connected to said control side, and whose drain is operably connected to said negative output driver.

15. The circuit as recited in claim 12, wherein said amplifier further comprises a feedforward arrangement operably connected between said second stage amplifier transistor and said negative output driver.

16. The circuit as recited in claim 12, wherein said negative output driver further comprises:
   an N-channel DMOS whose drain is connected to said output stage output terminal, whose source is connected to said negative source voltage, and whose gate is connected to said redirector;
   a diode connected N-channel DMOS whose drain and gate are operably connected to said redirector and to the gate of said N-channel DMOS.

17. The circuit as recited in claim 12, wherein the gate and drain terminals of said first control side transistor are connected to said current source; and
   the gate and drain terminals of said second control side transistor are connected to the source terminal of said first control side transistor, and whose source terminal is operably connected to said second stage amplifier transistor.

* * * * *